US008556315B2

(12) United States Patent
Kampe

(10) Patent No.: US 8,556,315 B2
(45) Date of Patent: Oct. 15, 2013

(54) VACUUM GRIPPER ASSEMBLY

(75) Inventor: Thorsten Kampe, Kitchener (CA)

(73) Assignee: ATS Automation Tooling Systems Inc., Cambridge (CA)

( * ) Notice: Subject to any disclaimer, the term of this patent is extended or adjusted under 35 U.S.C. 154(b) by 253 days.

(21) Appl. No.: 12/751,279

(22) Filed: Mar. 31, 2010

(65) Prior Publication Data

US 2010/0253106 A1 Oct. 7, 2010

Related U.S. Application Data

(60) Provisional application No. 61/165,117, filed on Mar. 31, 2009.

(51) Int. Cl.
*A47J 45/00* (2006.01)
(52) U.S. Cl.
USPC .......................... 294/183; 294/64.2; 294/213
(58) Field of Classification Search
USPC ........ 294/183, 64.2, 902, 185, 123, 219, 213; 414/935, 941, 737, 744.8, 752.1; 901/40
See application file for complete search history.

(56) References Cited

U.S. PATENT DOCUMENTS

| | | | |
|---|---|---|---|
| 5,423,558 A | 6/1995 | Koeth et al. | |
| 5,967,578 A * | 10/1999 | Frey | 294/64.3 |
| 6,077,026 A * | 6/2000 | Shultz | 414/744.1 |
| 6,454,517 B1 * | 9/2002 | Ohno | 414/783 |
| 7,292,427 B1 | 11/2007 | Murdoch et al. | |
| 2004/0246459 A1 | 12/2004 | Tinnemans et al. | |
| 2005/0006916 A1 * | 1/2005 | Mantz | 294/103.1 |
| 2005/0052041 A1 | 3/2005 | Bonora et al. | |
| 2005/0095115 A1 | 5/2005 | Tateyama et al. | |
| 2005/0110292 A1 | 5/2005 | Baumann et al. | |
| 2006/0249965 A1 * | 11/2006 | Gerhard et al. | 294/64.1 |
| 2007/0022588 A1 | 2/2007 | Kent | |
| 2009/0096229 A1 | 4/2009 | Bonora et al. | |
| 2010/0171331 A1 | 7/2010 | Jonas et al. | |

OTHER PUBLICATIONS

International Searching Authroity (CA), International Search Report, Jul. 20, 2010, PCT/CA2010/000493.
International Searching Authroity (CA), The Written Opinion of the International Searching Authority, Jul. 20, 2010, PCT/CA2010/000493.
Canadian Intellectual Property Office (IPEA/CA), Form PCT/IPEA/416 Notification of Transmittal of International Preliminary Report on Patentability dated Aug. 12, 2011, International Application No. PCT/CA2010/000493, Quebec Canada.
European Patent Office, Extended European Search Report, EP Application No. 10757974.0, dated Feb. 6, 2012.

* cited by examiner

*Primary Examiner* — Stephen Vu
(74) *Attorney, Agent, or Firm* — Borden Ladner Gervais LLP; Neil Henderson

(57) ABSTRACT

According to one aspect herein, there is provided a vacuum gripper assembly for gripping an object, the vacuum gripper assembly including: a gripper finger comprising a flat plate; a vacuum pad; a supporting system for supporting the vacuum pad in relation to the gripper finger; and a stabilization structure adapted to stabilize the at least one vacuum pad in a generally flat orientation in relation to the flat plate of the gripper finger when the vacuum gripper assembly is not gripping the object.

14 Claims, 5 Drawing Sheets

VACUUM GRIPPER ASSEMBLY

This application claims priority from U.S. Provisional Patent Application No. 61/165,117 filed Mar. 31, 2009, which is hereby incorporated by reference herein in its entirety.

FIELD

This application relates to a vacuum gripper assembly, and in particular, a vacuum gripper assembly for use with solar wafers.

BACKGROUND

A conventional vacuum gripper assembly typically includes a generally flat plate provided with one or more vacuum gripping elements. The vacuum gripping element may be, for example, a plastic pad supported in an opening in the plate. The plastic pad is provided with an inlet for a vacuum hose and a plurality of smaller holes on the surface thereof through which suction is applied to create a local area of reduced pressure (vacuum). In order to avoid breakage of the wafers, which are often extremely thin, as well as to allow for variations in wafer thickness and/or positioning the pad is typically provided with a shock absorbing mechanism that allows the pad to move slightly in the X, Y and Z directions. In one example, the pad may be mounted to the plate using springs that allow damped motion of the pad within the opening in the plate. The ability of the pad to move slightly is intended to allow the pad to conform to the shape of the wafer in order to provide a secure vacuum grip on the wafer when the wafer is brought adjacent to the plate and the pad, as well as to prevent the pad sliding on the wafer when the wafer is brought in contact with another object and relative displacement between the wafer and the gripper may occur.

In conventional vacuum grippers, particularly of the type described, there appears to be a relatively large amount of wastage. This appears to occur in situations where the vacuum gripper does not adequately attach to the wafer. Attempts in the industry to resolve this issue have been unsuccessful. For example, providing a larger vacuum pressure to overcome missing the attachment to a wafer can result in additional breakage due to the strength of the vacuum pressure being too high.

Further, the assembly and the maintenance of a gripper having a pad supported by springs can also be expensive and time consuming.

As such there is a need for an improved vacuum gripper assembly.

SUMMARY

According to one aspect herein, there is provided a vacuum gripper assembly for gripping an object, the vacuum gripper assembly including: a gripper finger comprising a flat plate; a vacuum pad; a supporting system for supporting the vacuum pad in relation to the gripper finger; and a stabilization structure adapted to stabilize the at least one vacuum pad in a generally flat orientation in relation to the flat plate of the gripper finger when the vacuum gripper assembly is not gripping the object.

In a particular case, the stabilization structure may be configured to stabilize in at least two dimensions.

In another particular case, the stabilization structure may be a stabilization armature that is configured to contact the vacuum pad as a plane surface. In this case, the stabilization armature may be a leaf spring.

In some cases, the supporting system may comprise a plurality of tension springs or a plurality of leaf springs that are connected either directly or indirectly between the vacuum pad and the flat plate of the gripper finger.

In a further particular case, the vacuum gripper assembly may further include a hose connecting a vacuum source to the vacuum pad and the stabilization structure can be configured to provide enough force to stabilize the vacuum pad against any forces imparted to the vacuum pad by the position of the hose when the vacuum gripper assembly is not gripping the object.

In another particular case, the supporting system and the stabilization structure may comprise a combined system (sometimes referred to as a combined support and stabilization structure). In this case, the supporting system may include a side compliance portion and a normal compliance portion connecting the vacuum pad to the flat plate via the stabilization structure. In particular, the elements of the combined system may include a plurality of leaf springs.

In another particular case, the stabilization structure may be configured to allow for movement in the X, Y and Z directions when gripping but biased to return to a predetermined position when not gripping.

In some cases, the stabilization structure may further include a pad flange on the vacuum pad that is configured to abut with a flange extending from the flat plate.

According to another aspect herein, there is provided a vacuum gripper assembly for gripping an object, the vacuum gripper assembly including: a vacuum gripper finger plate; at least one vacuum pad attached by a support system, the support system including a side compliance portion and a normal compliance potion, to the vacuum gripper finger plate; a hose connecting a vacuum source to the at least one vacuum pad; and a stabilization structure adapted to stabilize the at least one vacuum pad in a generally flat orientation in relation to the vacuum gripper finger plate when the vacuum gripper assembly is not gripping the object.

In a particular case, the support system and the stabilization structure may be a combined system.

In another particular case, the vacuum pad may further include a pad flange that is configured to abut with a flange extending from the vacuum gripper figure plate.

According to another aspect herein, there is provided a vacuum gripper finger assembly for gripping an object, the vacuum gripper finger assembly including: a vacuum gripper finger plate; at least one vacuum pad flexibly connected to the vacuum gripper finger plate; a hose connecting a vacuum source to the at least one vacuum pad; and a stabilization structure adapted to stabilize the at least one vacuum pad in a generally flat orientation in relation to the vacuum gripper finger plate when the vacuum gripper finger assembly is not gripping the object.

According to another aspect herein, there is provided a combined support and stabilization structure for supporting and stabilizing a vacuum pad in relation to a flat plate, the structure including: a side compliance portion configured to contact the sides of the vacuum pad to flexibly support the vacuum pad in a first dimension; a normal compliance portion configured to connect the side compliance portion and contact a surface of the vacuum pad to support the vacuum pad in a second dimension; and a stabilization member configured to connect with the normal compliance portion and provide support to the vacuum pad in a third dimension.

BRIEF DESCRIPTION OF THE DRAWINGS

For a better understanding of the embodiments described herein and to show more clearly how they may be carried into effect, reference will now be made, by way of example only, to the accompanying drawings which show the exemplary embodiments and in which.

DETAILED DESCRIPTION

Figure 1:
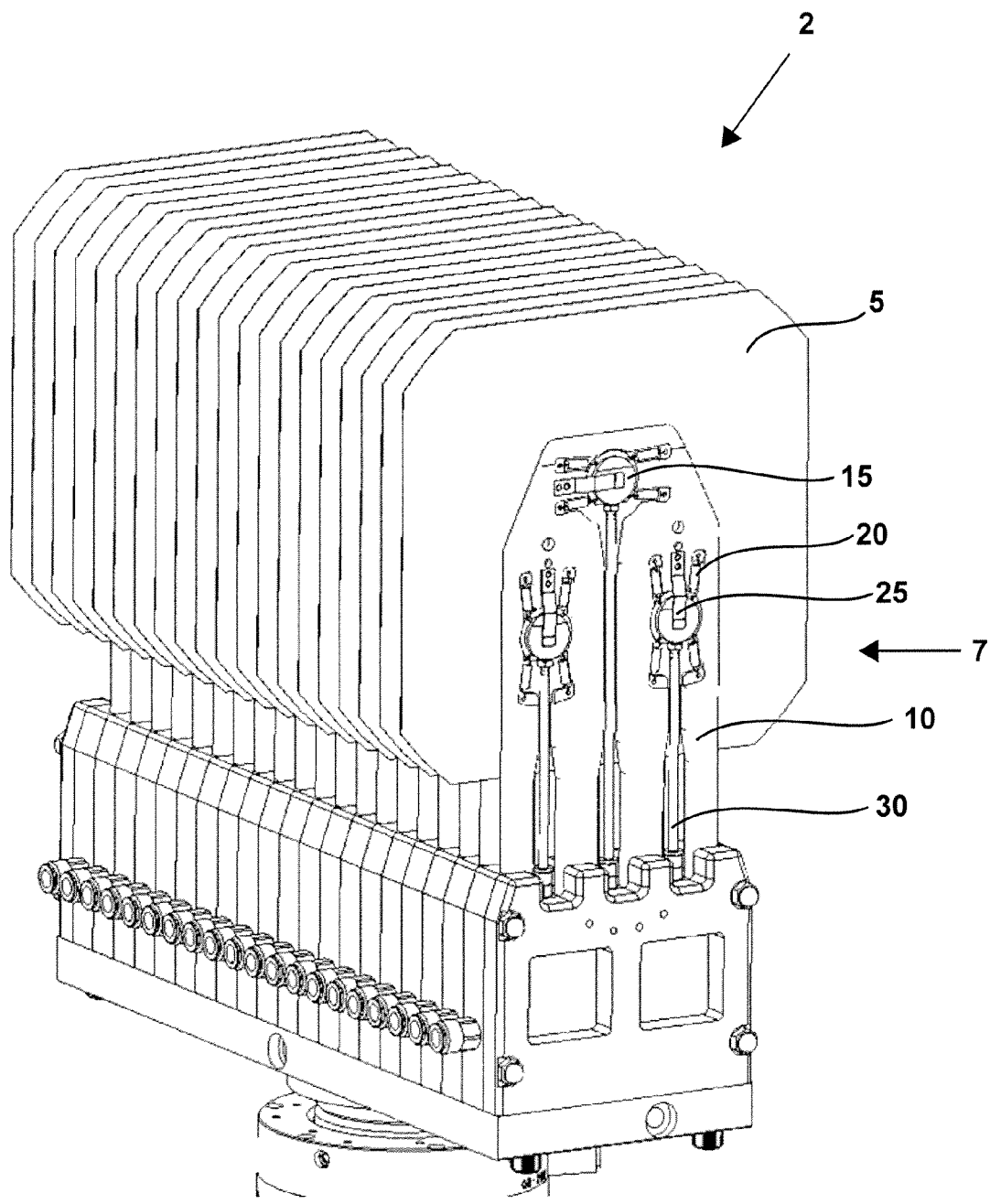
FIG. 1 is a perspective view of an embodiment of a vacuum gripper assembly; in which the vacuum gripper assembly is illustrated holding silicon wafers.

It will be appreciated that for simplicity and clarity of illustration, where considered appropriate, reference numerals may be repeated among the figures to indicate corresponding or analogous elements or steps. In addition, numerous specific details are set forth in order to provide a thorough understanding of the exemplary embodiments described herein. However, it will be understood by those of ordinary skill in the art that the embodiments described herein may be practiced without these specific details. In other instances, well-known methods, procedures and components have not been described in detail so as not to obscure the embodiments described herein. Furthermore, this description is not to be considered as limiting the scope of the embodiments described herein in any way, but rather as merely describing the implementation of the various embodiments described herein.

FIG. 1 shows an improved vacuum gripper assembly 2 that is intended to overcome at least some of the problems with conventional vacuum grippers. In FIG. 1, the vacuum gripper assembly 2 is shown holding a plurality of wafers 5. In particular, the wafers 5 may be silicon wafers. The vacuum gripper assembly 2 is comprised of one or more gripper finger assemblies 7 (in this case twenty are shown but an appropriate number may be selected depending on the application). As illustrated in FIG. 1, each gripper finger assembly 7 makes contact with and grips the wafer 5 using vacuum. This type of vacuum gripper assembly 2 is particularly applied to gripping solar cell wafers during loading and unloading into a specialized boat (not shown) used in plasma enhanced chemical vapor deposition (PECVD) processes.

Figure 2:
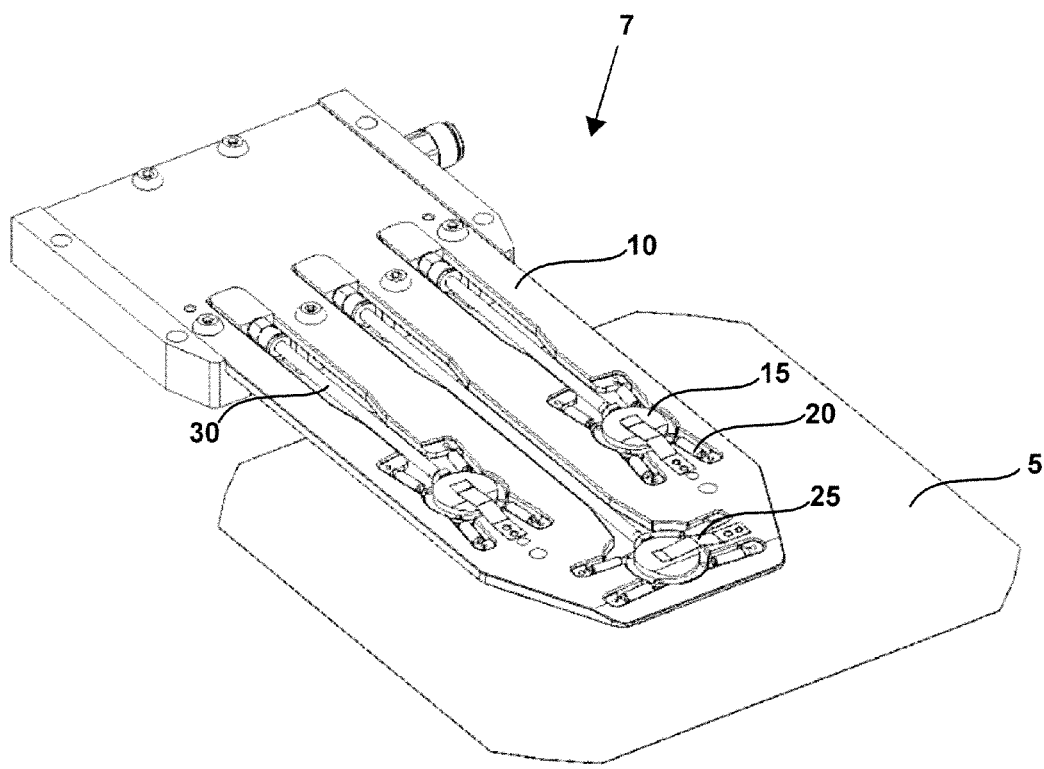
FIG. 2 is a perspective bottom view of a gripper finger of the vacuum gripper assembly of FIG. 1.

FIG. 2 shows a perspective bottom view of an example gripper finger assembly 7. In this case, the gripper finger assembly 7 is comprised of a gripper finger plate 10 and three vacuum pads 15, although other numbers of vacuum pads are contemplated. Each vacuum pad 15 is connected to a vacuum source (not shown) by a flexible hose 30. Each vacuum pad 15 is supported in relation to the gripper finger plate 10 by a support system 20. In the embodiment shown in FIG. 2, the support system 20 comprises four tension springs that attach and support the vacuum pad 15 to the gripper finger plate 10. It will be understood that other supporting systems 20 are possible. The support system 20 is configured to allow for slight movement or rotation of the vacuum pad 15 in the X, Y and Z directions (that is, in three dimensions).

Figure 3:
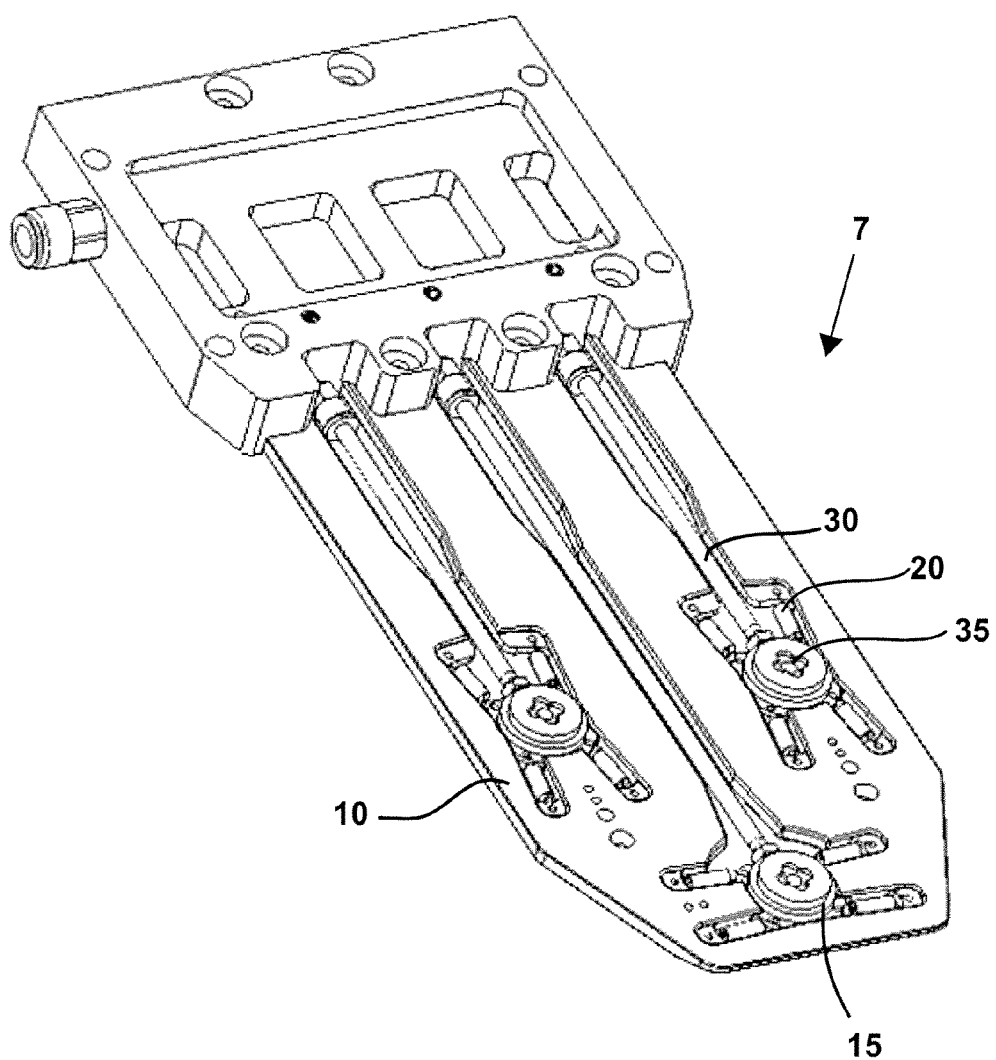
FIG. 3 is a perspective top view of the gripper finger of FIG. 2.

FIG. 3 shows a perspective top view of the gripper finger assembly 7. As shown in FIG. 3, the vacuum pad 15 includes a vacuum opening 35 at which reduced pressure (vacuum) is applied to grip the wafer 5.

An investigation of conventional vacuum grippers has led to the identification of a previously unidentified problem. Although not recognized in industry, one of the issues in conventional vacuum grippers is that, in operation, the flexible tube or hose connected between the vacuum source and the vacuum pad would occasionally become moved or jarred by other parts or by movement of the vacuum gripper assembly, such that the vacuum pad would not remain in a generally flat position when in a rest state (i.e. when not attempting to grip a wafer). This situation could cause the vacuum gripper to inadequately grip a wafer or in some circumstances, could cause the vacuum gripper to break a wafer when being inserted adjacent to the wafer.

Following identification of this problem, it was determined that it is important for the vacuum pad 15 to be in or return to a substantially flat orientation in relation to the gripper finger plate 10 when the vacuum gripper assembly 2 is not gripping a wafer 5. The vacuum pad 15 still needs to be able to move in X, Y and Z directions when in a gripping state to be able to gently and accurately contact the wafer 5 to provide an effective and efficient grip of the wafer 5. In order to ensure that the vacuum pad 15 is in a substantially flat orientation to the gripper finger plate 10 when in a rest state, a stabilizing structure 25 can be used to apply a biasing force to the vacuum pad 15. By selecting appropriate materials and force profile, the stabilizing structure 25 can be configured to allow for slight movement in the X, Y and Z directions but also stabilize the vacuum pad 15 and allow it to remain oriented in a generally flat position in relation to the gripper finger plate 10 when in a rest state. In particular, the stabilizing force must generally be sufficient to overcome forces placed on the vacuum pad 15 by movement or jarring of the gripper finger plate 10 or the hose 30.

Figure 4:
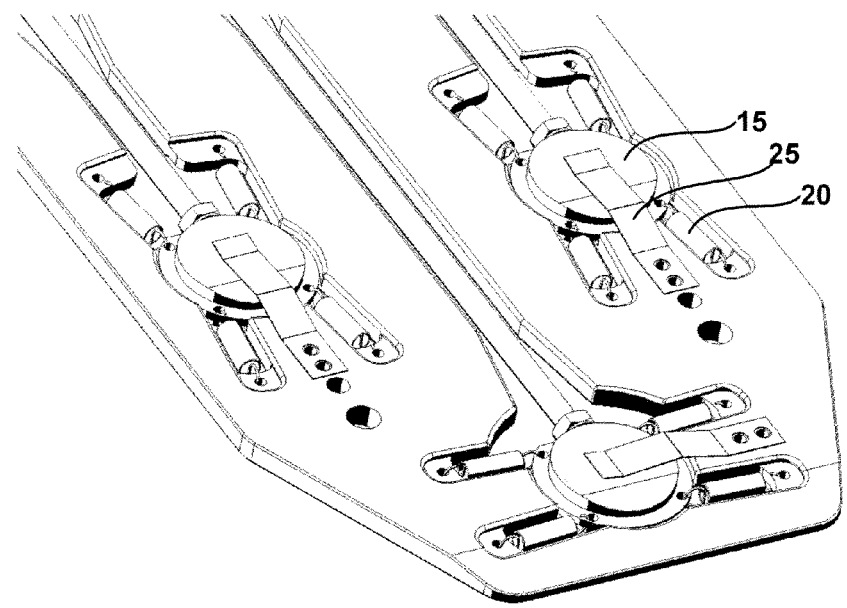
FIG. 4 is a perspective view of a vacuum pad section of the gripper finger of FIG. 2.

FIG. 4 shows a more detailed view of a tip of the gripper finger assembly 7, including three vacuum pads 15, together with the support system (tension springs) 20, and the stabilizing structure 25. In the embodiment of FIG. 4, the stabilization structure 25 is a stabilizing armature that is connected to the gripper finger plate 10 and contacts the vacuum pad 15. The stabilizing armature 25 is configured to provide enough biasing force to stabilize the vacuum pad 15 in a substantially flat position in relation to the plate 10 when the vacuum pad is in a rest state and the vacuum is not applied, for example, when no wafer is present. However, the stabilizing armature 25 is also configured such that, when a vacuum is applied, the vacuum pad 15 is capable of flexible movements in the X, Y and Z directions in order to accommodate the gripping of the wafer 5. In this particular embodiment, the stabilizing armature 25 is a leaf spring that extends from the finger gripper plate 10 to be in contact with the vacuum pad 15 with a point of contact that represents a two-dimensional plane surface to stabilize the vacuum pad 15 in relation to the gripper finger plate 10. With this arrangement, the stabilizing armature 25 is arranged to stabilize the vacuum pad 15 in three dimensions.

Figure 5:
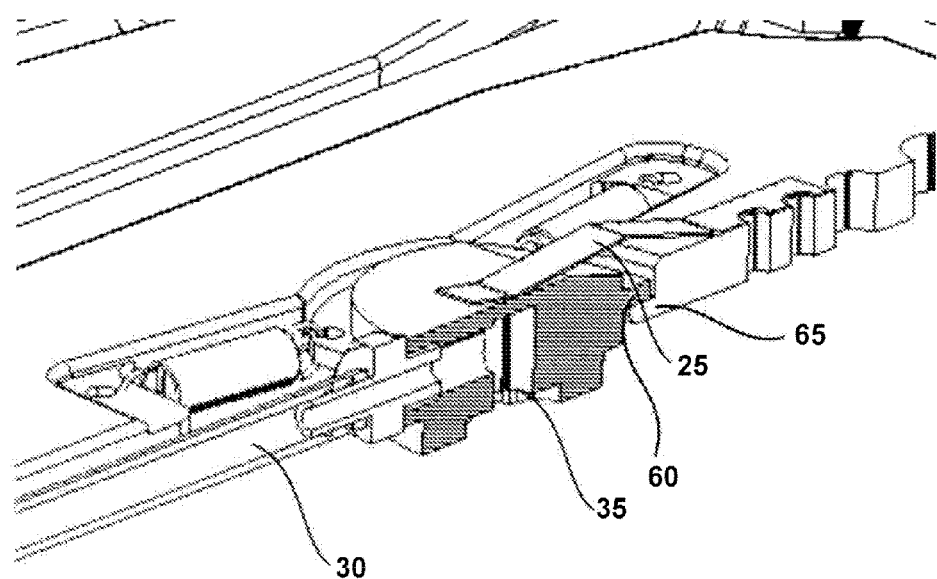
FIG. 5 is a cross section view of the vacuum pad section of the gripper finger of FIG. 2.

FIG. 5 shows a cross-sectional view of the gripper finger assembly 7 and vacuum pad 15, illustrating the vacuum hose 30 in communication with the vacuum opening 35. As shown in FIG. 5, the vacuum pad 15 includes a pad flange 60 that abuts a plate flange 65 provided to the vacuum finger plate 10 to provide a reference plane that the stabilizing armature 25 can press the vacuum pad against. In some cases, the interacting pad flange 60 and plate flange 65 can be considered elements of the stabilization structure 25 in that they can assist with keeping the vacuum pad 15 in a flat orientation in relation to the finger gripper plate 10.

It will be understood that the gripper finger assembly 7 in FIGS. 4 and 5 is an example gripper finger assembly 7 only and a gripper finger assembly 7 may have a different shape or arrangement and may have one or more vacuum pads 15 depending on the needs of the particular application for which the gripper finger assembly 7 is used. Although FIGS. 4 and 5 show a vacuum pad 15 having a stabilization structure 25 formed by one stabilization armature 25, it will be understood that the stabilization structure 25 may comprise a plurality of stabilization armatures (not shown) provided to the vacuum gripper finger assembly 7, possibly on either side of the vacuum pad 15 or attached on the same side. The location of the stabilization structure 25 in relation to the vacuum pad 15 may be also modified in relation to the location where the vacuum hose 30 enters the vacuum pad 15. Similarly, the pad flange 60 and plate flange 65 may be formed in different shapes or configurations while maintaining the function of providing a meshing surface by which the bias of the stabilizing armature 25 can be supported. With knowledge of the present embodiments, these modifications would generally be understood by those skilled in the art and are intended to be within the scope of this application.

The use of a stabilization structure is expected to provide significant improvements in the ability of the gripper to successfully grip wafers and manipulate the wafers without breakage or wastage of material.

Figure 6:
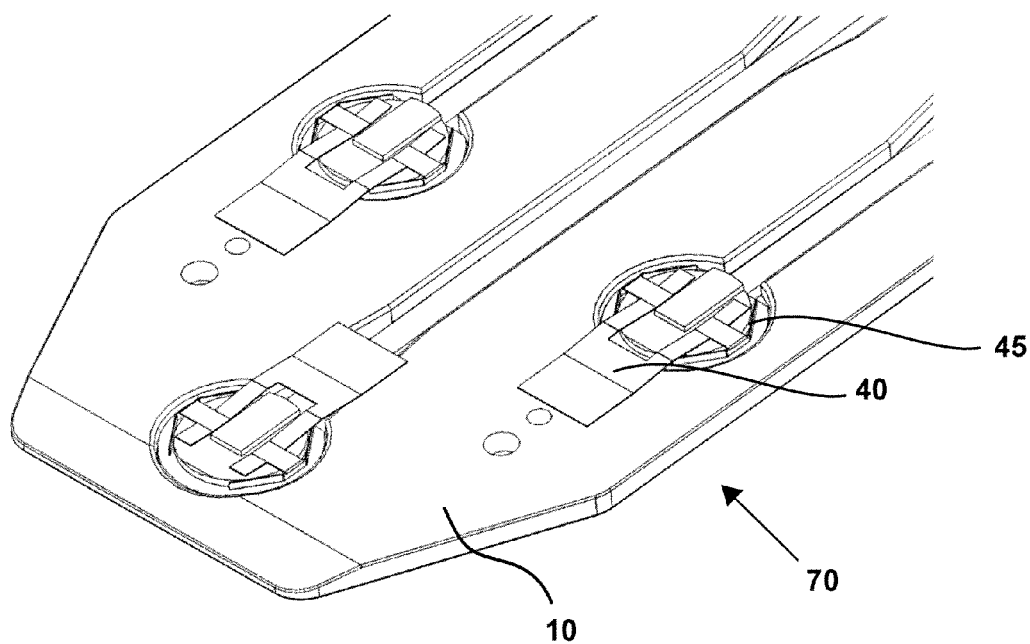
FIG. 6 shows another embodiment of the vacuum gripper assembly having an alternate embodiment of the stabilizing armature.
Figure 7:
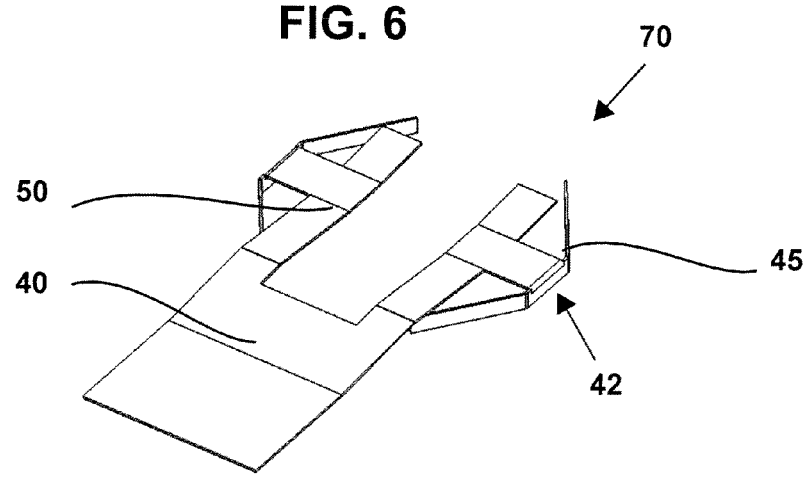
FIG. 7 shows an enlarged perspective view of the stabilizing armature of FIG. 6.

Another embodiment of the gripper finger plate 10, which makes use of a combined support and stabilization structure 70, is shown in FIG. 6. FIG. 7 is an enlarged view of the combined support and stabilization structure 70 of FIG. 6. In this embodiment, the combined support and stabilization structure 70 includes a stabilization structure 40 and a support system 42. In particular, the stabilization structure 40 is a stabilization armature 40 that is combined with a side compliance portion 45 and a normal compliance portion 50. In this embodiment, the side compliance portion 45 and normal compliance portion 50 are generally intended to replace the function of the tension springs 20. The side compliance portion 45 is configured to fit around the sides of the vacuum pad 15 and the normal compliance portion 50 is configured to fit across a surface of the vacuum pad 15, in this case, a back surface. Here, the side compliance portion 45 and the normal compliance portions 50 are also formed as leaf springs. This configuration of the combined support and stabilizing structure 70 allows the X,Y and Z motions of the vacuum pad to be controlled by the various leaf springs but is biased to return to a flat orientation in relation to the gripper finger plate 10. This embodiment of the multi-axis combined support and stabilization structure 70 is intended to provide easier vacuum gripper maintenance and assembly time because vacuum pads 15 can be more easily replaced as there is no need to detach/attach the tension springs 20.

It will be appreciated that, once the embodiments herein are understood, various forms of stabilization structures or other devices to provide the required stabilization to the vacuum pad will be apparent to those of skill in the art, all of which are encompassed by the present application.

It should be understood that various other modifications can be made to the exemplary embodiments described and illustrated herein, without departing from the general scope of the present application. It will be understood that other embodiments will be apparent to those skilled in the art based on the disclosure of the above embodiments. In particular, it should be understood that while the embodiments have been described for vacuum grippers having disk-shaped vacuum pads, the embodiments are generally applicable to other shapes of vacuum pads or the like.

I claim:

1. A vacuum gripper assembly for gripping an object, the vacuum gripper assembly comprising:
   a gripper finger comprising a flat plate;
   a vacuum pad;
   a supporting system for supporting the vacuum pad in relation to the gripper finger such that the vacuum pad can move linearly in three dimensions in relation to the gripper finger;
   a stabilization structure adapted to bias the at least one vacuum pad to a generally flat orientation in relation to the flat plate of the gripper finger when the vacuum gripper assembly is not gripping the object and wherein the stabilization structure is configured to bias the vacuum pad to be in contact with the object being gripped; and a hose connecting a vacuum source to the vacuum pad and wherein the stabilization structure is configured to provide enough force to stabilize the vacuum pad against any forces imparted to the vacuum pad by a position of the hose when the vacuum gripper assembly is not gripping an object.

2. The vacuum gripper assembly of claim 1, wherein the stabilization structure is configured to stabilize in at least two dimensions.

3. The vacuum gripper assembly of claim 1, wherein the stabilization structure is a stabilization armature that is configured to contact the vacuum pad as a plane surface.

4. The vacuum gripper assembly of claim 3, wherein the stabilization armature is a leaf spring.

5. The vacuum gripper assembly of claim 1, wherein the supporting system and the stabilization structure comprise a combined system.

6. The vacuum gripper assembly of claim 5, wherein the supporting system comprises a side compliance portion and a normal compliance portion connecting the vacuum pad to the flat plate via the stabilization structure.

7. The vacuum gripper assembly of claim 1, wherein the stabilization structure is configured to allow for movement in the X, Y and Z directions when gripping but biased to return to a predetermined position when not gripping.

8. The vacuum gripper assembly of claim 1, wherein the stabilization structure further comprises a pad flange on the vacuum pad that is configured to abut with a flange extending from the flat plate.

9. A vacuum gripper assembly for gripping an object, the vacuum gripper assembly comprising:
   a gripper finger comprising a flat plate;
   a vacuum pad;
   a supporting system for supporting the vacuum pad in relation to the gripper finger; and
   a stabilization structure adapted to stabilize the at least one vacuum pad in a generally flat orientation in relation to the flat plate of the gripper finger when the vacuum gripper assembly is not gripping the object;
   wherein the supporting system and the stabilization structure comprise a combined system;
   wherein the supporting system comprises a side compliance portion and a normal compliance portion connecting the vacuum pad to the flat plate via the stabilization structure; and
   wherein the side compliance portion, normal compliance portion and stabilization structure comprise a plurality of leaf springs.

10. A vacuum gripper assembly for gripping an object, the vacuum gripper assembly comprising:

a vacuum gripper finger plate;

at least one vacuum pad attached by a support system to the vacuum gripper finger plate, the support system comprising a side compliance portion and a normal compliance portion wherein the vacuum pad can move linearly in three dimensions in relation to the vacuum gripper finger plate;

a hose connecting a vacuum source to the at least one vacuum pad; and a stabilization structure adapted to bias the at least one vacuum pad to a generally flat orientation in relation to the vacuum gripper finger plate when the vacuum gripper assembly is not gripping the object and wherein the stabilization structure is configured to bias the vacuum pad to be in contact with the object being gripped and to provide enough force to stabilize the vacuum pad against any forces imparted to the vacuum pad by a position of the hose when the vacuum gripper assembly is not gripping an object.

11. The vacuum gripper assembly of claim 10, wherein the support system and the stabilization structure are a combined system.

12. The vacuum gripper assembly of claim 10, wherein the vacuum pad further comprises a pad flange that is configured to abut with a flange extending from the vacuum gripper figure plate.

13. A vacuum gripper finger assembly for gripping an object, the vacuum gripper finger assembly comprising:

a vacuum gripper finger plate;

at least one vacuum pad flexibly connected to the vacuum gripper finger plate, wherein the vacuum pad can move linearly in three dimensions in relation to the vacuum gripper finger plate; and a stabilization structure adapted to bias the at least one vacuum pad to a generally flat orientation in relation to the vacuum gripper finger plate when the vacuum gripper finger assembly is not gripping the object and wherein the stabilization structure is configured to bias the vacuum pad to be in contact with the object being gripped; and a hose connecting a vacuum source to the vacuum pad and wherein the stabilization structure is configured to provide enough force to stabilize the vacuum pad against any forces imparted to the vacuum pad by a position of the hose when the vacuum gripper assembly is not gripping an object.

14. A combined support and stabilization structure for supporting and stabilizing a vacuum pad in relation to a flat plate, the structure comprising:

a side compliance portion configured to contact the sides of the vacuum pad to flexibly support the vacuum pad in a first linear dimension;

a normal compliance portion configured to connect the side compliance portion and contact a surface of the vacuum pad to support the vacuum pad in a second linear dimension; and a stabilization member configured to connect with the normal compliance portion and provide support to the vacuum pad in a third linear dimension;

wherein the vacuum pad is biased in a generally flat orientation in relation to the flat plate when the vacuum pad is not gripping an object;

wherein the stabilization member is configured to bias the vacuum pad to be in contact with the object being gripped; and a hose connecting a vacuum source to the vacuum pad and wherein the stabilization structure is configured to provide enough force to stabilize the vacuum pad against any forces imparted to the vacuum pad by a position of the hose when the vacuum gripper assembly is not gripping an object.

* * * * *